United States Patent
Ghaffari et al.

(10) Patent No.: US 11,994,496 B2
(45) Date of Patent: May 28, 2024

(54) NON-DESTRUCTIVE EVALUATION SYSTEM FOR INSPECTION OF WELD AND BRAZE JOINTS

(71) Applicants: Ford Global Technologies, LLC, Dearborn, MI (US); University of Windsor, Windsor (CA)

(72) Inventors: Bita Ghaffari, Ann Arbor, MI (US); Elizabeth Therese Hetrick, Ann Arbor, MI (US); Roman Maev, Windsor (CA); Andrew Ouellette, Windsor (CA)

(73) Assignees: Ford Global Technologies, LLC, Dearborn, MI (US); University of Windsor, Windsor (CA)

( * ) Notice: Subject to any disclaimer, the term of this patent is extended or adjusted under 35 U.S.C. 154(b) by 389 days.

(21) Appl. No.: 17/318,587

(22) Filed: May 12, 2021

(65) Prior Publication Data
US 2022/0365037 A1   Nov. 17, 2022

(51) Int. Cl.
*G01N 29/26* (2006.01)
*G01N 29/04* (2006.01)
(Continued)

(52) U.S. Cl.
CPC ......... *G01N 29/262* (2013.01); *G01N 29/041* (2013.01); *G06F 30/12* (2020.01);
(Continued)

(58) Field of Classification Search
CPC .. G01N 29/262; G01N 29/041; G01N 29/043; G01N 29/28; G01N 29/32;
(Continued)

(56) References Cited

U.S. PATENT DOCUMENTS

| | | | | |
|---|---|---|---|---|
| 6,125,705 A | * | 10/2000 | Johnson | G01N 29/265 73/598 |
| 6,178,819 B1 | * | 1/2001 | Smartt | G01N 29/265 73/598 |

(Continued)

FOREIGN PATENT DOCUMENTS

| | | |
|---|---|---|
| JP | 2012112658 | 6/2012 |
| JP | 6058284 | 1/2017 |

(Continued)

OTHER PUBLICATIONS

Budyn, et al., A Model for Multiview Ultrasonic Array Inspection of Small Two-Dimensional Defects, IEEE Transactions on Ultrasonics, Ferroelectrics, and Frequency Control, Jun. 2019, pp. 1129-1139, vol. 66(6).

(Continued)

*Primary Examiner* — Jacques M Saint Surin
(74) *Attorney, Agent, or Firm* — Burris Law, PLLC

(57) ABSTRACT

An inspection probe and system for inspecting a welded or brazed joint includes a housing having an internal cavity and opposed tapered standoffs disposed at a distal end portion of the housing. Distal ends of the opposed tapered standoffs define pivot surfaces, and the opposed tapered standoffs are spaced apart to define a secondary enclosure. A plurality of transducer elements are disposed within the internal cavity of the housing and a primary coupling medium made of a flexible, semi-solid material is secured between the opposed tapered standoffs. A signal processing module is in communication with a data acquisition unit, which is in communication with the transducer elements. The inspection probe is rotated across the joint, data from the transducer elements is communicated to the signal processing module, and reconstructed and corrected images obtained at different angles (Continued)

from the transducer elements are stitched to generate an inspection image.

20 Claims, 7 Drawing Sheets

(51) Int. Cl.
  *G06F 30/12* (2020.01)
  *G06T 3/4038* (2024.01)
  *G06T 7/00* (2017.01)
(52) U.S. Cl.
  CPC .......... *G06T 3/4038* (2013.01); *G06T 7/0004* (2013.01); *G01N 2291/106* (2013.01)
(58) Field of Classification Search
  CPC ........ G01N 29/04; G01N 29/07; G01N 29/09; G01N 29/22; G01N 2291/011; G01N 2291/018; G01N 2291/023; G01N 2291/267; G01N 2291/106; G06F 30/12; G06T 3/4038; G06T 7/0004
  USPC .......................................................... 73/584
  See application file for complete search history.

(56) References Cited

U.S. PATENT DOCUMENTS

| 7,789,286 | B2 | 9/2010 | Maev et al. |
| 9,037,419 | B2* | 5/2015 | Na .................... G01N 29/0645 |
| | | | 702/39 |
| 9,074,927 | B2* | 7/2015 | Singh .................... G01H 13/00 |
| 10,234,426 | B2* | 3/2019 | Todorov ............... G01N 29/262 |
| 2011/0120223 | A1 | 5/2011 | Maclauchlan et al. |
| 2016/0089110 | A1 | 3/2016 | Milkowski et al. |
| 2018/0067085 | A1 | 3/2018 | Ininger et al. |

FOREIGN PATENT DOCUMENTS

| WO | 2020084117 | | 4/2020 | |
| WO | WO 2021617835 | * | 8/2021 | ............. G01N 29/24 |

OTHER PUBLICATIONS

Kwan, et al., Olympus Industrial Resources TFM Acoustic Influence Map, Olympus Industrial Solutions, paper presented to ASNT Research Symposium, 2019, pp. 1-11, Olympus Corporation.

* cited by examiner

NON-DESTRUCTIVE EVALUATION SYSTEM FOR INSPECTION OF WELD AND BRAZE JOINTS

FIELD

The present disclosure relates to non-destructive testing devices and methods, and more particularly, devices and methods for inspecting welded or brazed metal joints.

BACKGROUND

The statements in this section merely provide background information related to the present disclosure and may not constitute prior art.

Welding and brazing techniques are routinely employed at automotive manufacturing companies, enabling high-volume production of a variety of body structures, such as by way of example, steel and aluminum. Notably, laser weld and laser braze joining methods are selected to deliver design flexibility and enable lightweighting, particularly for applications where access, flange size and cycle time are constrained.

In these steel and aluminum body structures, the quality of weld and braze joints is commonly determined by destructive means such as section cuts or teardowns, leading to costly scrap and time expenditures, particularly when these joints present the final production steps (e.g., a vehicle roof). Additionally, a 'cut and etch' analysis is slow and labor intensive, permitting inspection of only a limited number of locations along each joint.

Many manufacturing specifications for welded or brazed joints require precise quantitative characterization of joint section geometry, as well as several possible imperfections, e.g., lack of adhesion or fusion, and presence of porosity, cracks, and inclusions. Each imperfection needs to be quantified separately and with a precision that is challenging for existing non-destructive evaluation methods (herein referred to as "NDE"). In addition, in most cases, access to only one side of the joint is available. Moreover, joints can be of very small sizes and have very high top-surface curvatures.

The present disclosure addresses these issues related to non-destructive evaluation of welded or brazed joints, for example in steel and aluminum structures, among other types of materials.

SUMMARY

This section provides a general summary of the present disclosure and is not a comprehensive disclosure of its full scope or all of its features.

In one form, an inspection probe is provided that comprises a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure. A plurality of transducer elements disposed within the internal cavity of the housing.

In variations of this inspection probe, which may be implemented individually or in any combination: a primary coupling medium made of a flexible, semi-solid material is secured between the opposed tapered standoffs within the secondary enclosure; a plurality of serrations are disposed on inner faces of the opposed tapered standoffs; the transducer elements form a one-dimensional array; the transducer elements form a two-dimensional array; the opposed tapered standoffs define arcuate outer profiles; and the opposed tapered standoffs are flexible.

In another form of the present disclosure, a system for inspecting a welded or brazed joint is provided that includes an inspection probe comprising a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure. A plurality of transducer elements are disposed within the internal cavity of the housing, and a primary coupling medium comprising a flexible, semi-solid material is secured between the opposed tapered standoffs. A signal processing module is in communication with the transducer elements, and a data acquisition unit in communication with the transducer elements.

In variations of this system, which may be implemented individually or in any combination, a graphical user interface is in communication with the signal processing module and configured to display a reconstructed image, or images, of the joint; the reconstructed image is one of a 2D image and a 3D image; the signal processing module comprises algorithms that stitch images obtained at different angles when the inspection probe is rotated or traversed across the joint; the stitched images are mapped to CAD (computer aided design) geometry for display on a graphical user interface; a pulsed energy wave is emitted from at least one of the plurality of transducer elements and signals reflected from the joint are recorded by at least one of the plurality of transducer elements; and the signal processing module calculates a series of time delays and amplitude scaling factors to correct raw data received from the plurality of transducer elements to compensate for acoustic-impedance mismatch and sound-speed mismatch between the primary coupling medium and the joint.

In yet another form of the present disclosure, a method of inspecting a welded or brazed joint comprises: (a) placing an inspection probe at an initial inspection position, the inspection probe comprising a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure, a plurality of transducer elements disposed within the internal cavity of the housing, and a primary coupling medium comprising a flexible, semi-solid material secured between the opposed tapered standoffs; (b) communicating data from the plurality of transducer elements to a signal processing module at the initial inspection position; (c) rotating the inspection probe across the joint about a pivot line extending between the opposed tapered standoffs to a stationary inspection position; (d) communicating data from the plurality of transducer elements to a signal processing module at the stationary inspection position; (e) stitching images obtained at different angles to generate an inspection image; and (f) optionally repeating steps (c) through (e) until a reconstructed image reaches a predetermined level of detail.

In variations of this method, which may be implemented individually or in any combination, the inspection probe is moved along the joint to another location a predetermined distance from the initial inspection position, and steps (c) through (f) are repeated for a predetermined number of locations along a length of the joint; a secondary coupling medium is applied between the joint and the primary coupling medium; a series of time delays and amplitude scaling factors are calculated to correct raw data received from the plurality of transducer elements to compensate for acoustic-impedance mismatch and sound-speed mismatch between the flexible, semi-solid material and the joint; the series of time delays and amplitude scaling factors are computed by simulating a signal propagation into the joint; and generating an amplitude distribution map and determining if the welded or brazed joint is sufficiently inspected.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
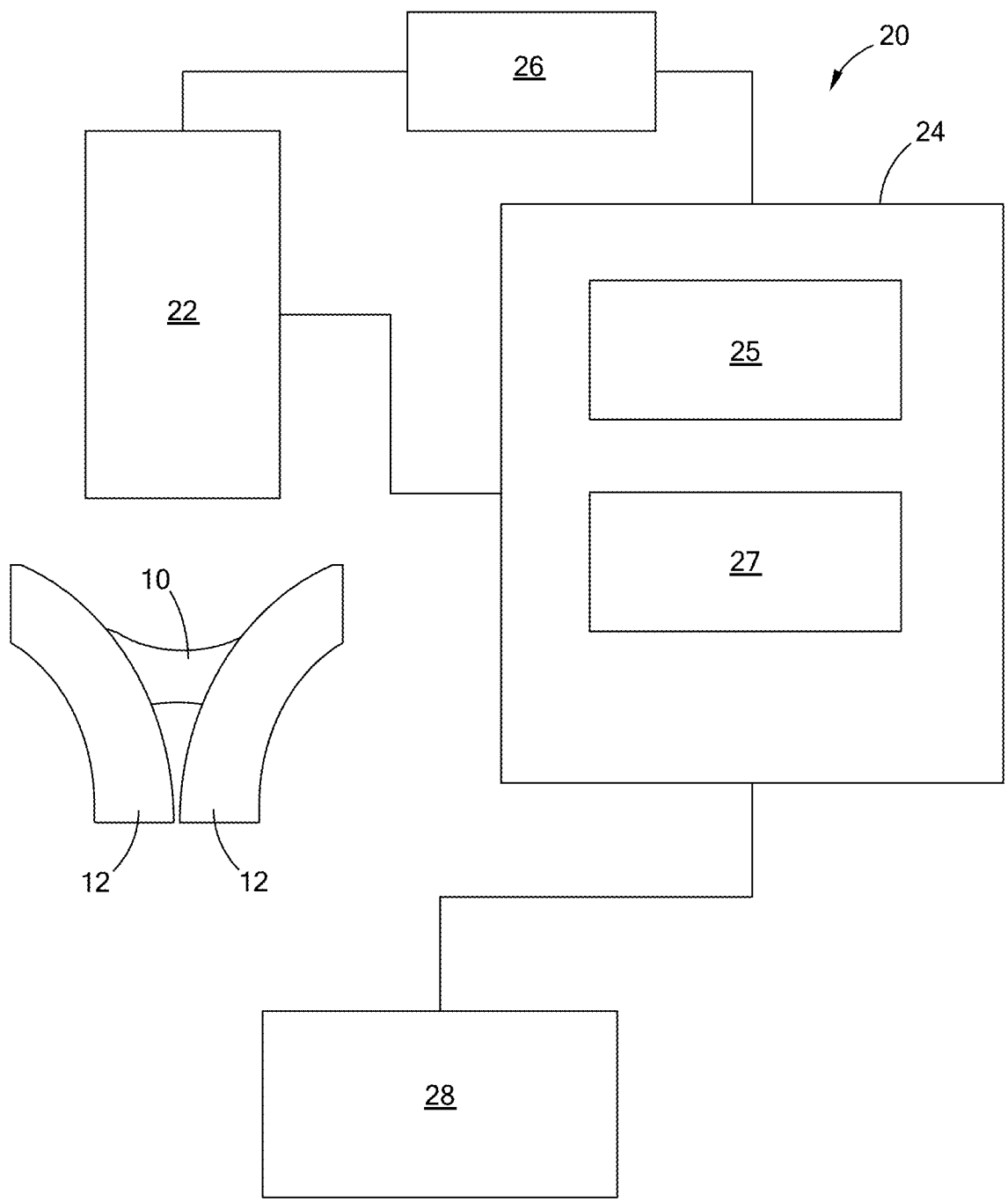
FIG. 1 is a block diagram of a system with an inspection probe according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In accordance with the teachings of the present disclosure, systems and methods for inspecting a welded or brazed joint are provided. The systems and related methods are able to couple, scan, and construct images of joints with highly curved surfaces, by utilizing an innovative inspection probe, combined with a flexible semi-solid material and in one form a fluid, or secondary, coupling material, and an enhanced data analysis algorithm, as described in greater detail below. In one form of the present disclosure, the flexible semi-solid material and the fluid coupling material are both a gel as described in greater detail below.

Referring to FIG. 1, a system for inspecting a welded or brazed joint 10 between at least two components 12 (or in the case of a repair as set forth below, a single component 12) is illustrated and generally indicated by reference numeral 20. While the system 20 may be utilized to examine any size of welded or brazed joints, the joint 10 in one form is a very small size (e.g. between components that are about 0.5 mm thick, with joint cross-sectional areas on the order of about 1 $mm^2$) and have very high top-surface curvatures (e.g. radii of curvature on the order of about 2 mm).

In some applications, the components 12 are structural and/or load bearing components that are joined together via the welded or brazed joint 10. In other applications, the components 12 are non-structural and/or non-load bearing components that are joined together via the welded or brazed joint 10. Additionally, the components 12 may be made of any type of material, including by way of example, aluminum, steel, other metals, polymers, and composites, among others. Furthermore, each of the components 12 may be made of the same material or different materials. Furthermore, the joint 10 may be contained within a single component 12 or may include more than two components 12 joined together while remaining within the scope of the present disclosure. For example, the welded or brazed joint 10 may have been executed to repair a split in a single sheet metal component or to repair a welded or brazed joint (e.g. if cracks are present). Accordingly, a component 12 or the joint 10 may be repaired and inspected according to the teachings herein.

The system 20 includes an inspection probe 22, a signal processing module 24, and a data acquisition unit 26. As described in greater detail below, the data acquisition unit 26 powers and transmits/receives data for proper functioning of the probe 22. In one form, the system 20 includes a graphical user interface 28 in communication with the signal processing module 24. The system 20 in one form is an ultrasonic inspection system, however, it should be understood that other types of NDE systems (e.g., x-ray, eddy current, among others) may be employed while remaining within the scope of the present disclosure. Further details of the signal processing module 24 and operation of the overall system 20 are described in greater detail below, after the following description of the innovative inspection probe 22.

Figure 2:
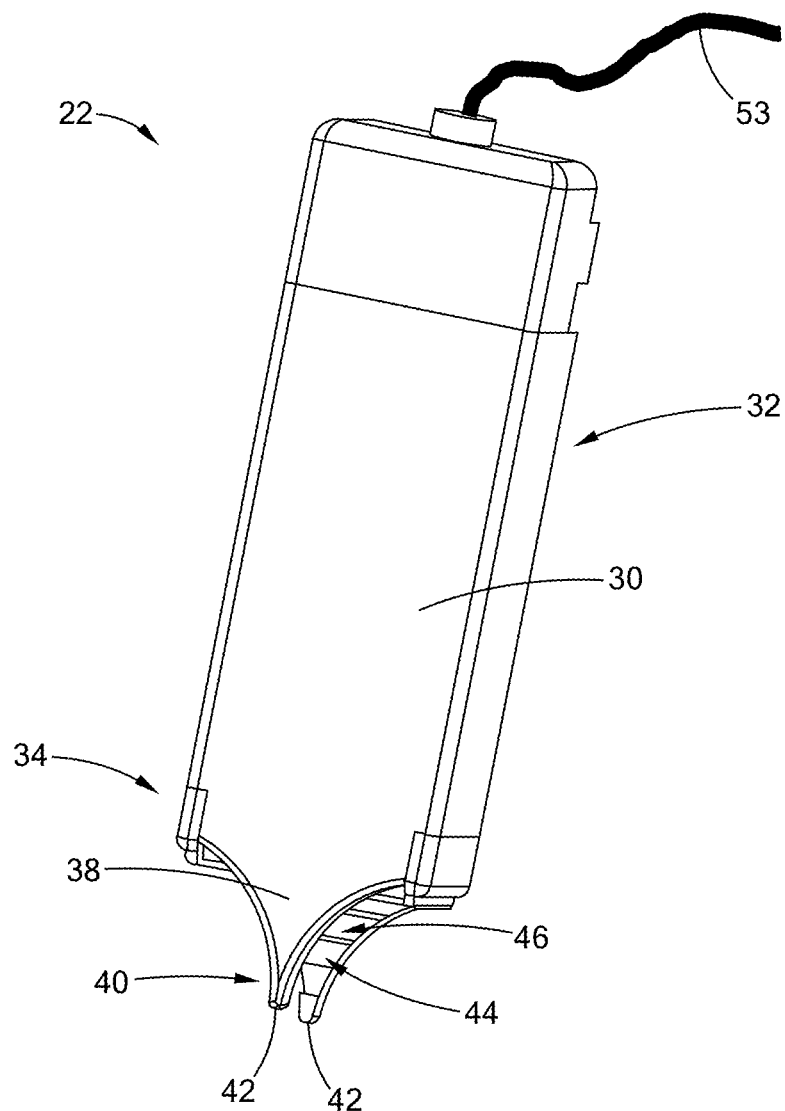
FIG. 2 is a perspective view of an inspection probe constructed in accordance with the teachings of the present disclosure.
Figure 3:
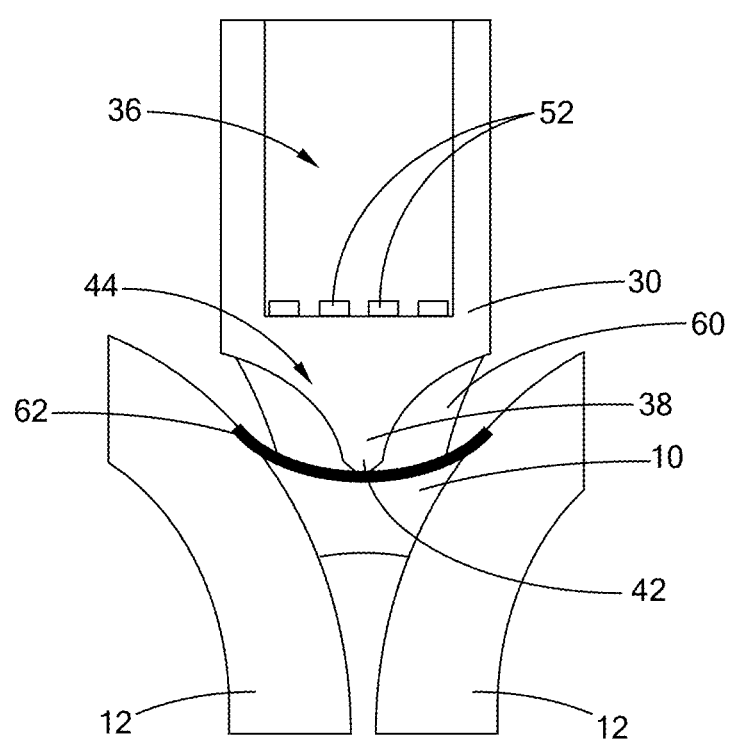
FIG. 3 is a side schematic view of the inspection probe of FIG. 2 inspecting a welded or brazed joint between two components according to the teachings of the present disclosure.

Referring to FIGS. 2 and 3, the inspection probe 22 comprises a housing 30 having a proximal end portion 32 and a distal end portion 34. The housing 30 further defines an internal cavity 36 and opposed tapered standoffs 38 disposed at the distal end portion 34. Distal ends 40 of the tapered standoffs 38 define pivot surfaces 42 (the function of which are described in greater detail below relative to operation of the inspection probe 22). Further, the opposed tapered standoffs 38 are spaced apart to define a secondary enclosure 44. The secondary enclosure 44 is configured to secure therewithin a primary coupling medium, which in one form is made of a flexible, semi-solid gel material, described in greater detail below. In one form as shown, a plurality of serrations 46 are disposed on inner faces of the opposed tapered standoffs 38. The serrations 46 are configured to grip the flexible, semi-solid gel material between the opposed tapered standoffs 38. The opposed tapered standoffs 38 may be flexible, or elastically deformable to capture the flexible, semi-solid gel material therebetween. Accordingly, the housing 30 may be formed of a polymeric material to provide, among other functional characteristics, the flexibility for the opposed tapered standoffs 38. It should be understood, however, that a variety of other materials may be employed for the housing 30 while remaining within the scope of the present disclosure. In another variation, the opposed tapered standoffs 38 define arcuate outer profiles as shown. This profile allows the inspection probe 22 to access small/tight spaces for inspection, as illustrated and described in greater detail below.

A plurality of transducer elements 52 are disposed within the internal cavity 36 of the housing 30, which in one form define a one-dimensional array. However, it should be understood that arrays greater than one-dimensional, such as a two-dimensional array, may be employed while remaining within the scope of the present disclosure. When an electrical current from the data acquisition unit 26 (FIG. 1) is applied to the transducer elements 52 through the electrical lead 53, the plurality of transducer elements 52 produce sound waves that travel to the joint 10.

More specifically, the signal processing module 24 outputs an electrical signal to the data acquisition unit 26 and thereby controls the data acquisition unit 26 and the transducer elements 52. As such, the data acquisition unit 26 sequentially selects one or more of the transducer elements 52 at a predetermined time cycle to become an output destination of electrical signals. In turn, the transducer elements 52 emit pulsed energy waves toward the joint 10. The joint 10 includes the upper surface (also referred to as a "face"), all weld/braze interfaces, all weld metal/braze metal boundaries, a volume in between these boundaries, one or more interfaces that may be located within the volume (e.g., porosity, cracks), and all unwelded fusion faces/unbrazed joint portions. The transducer elements 52 then receive the ultrasonic waves that reflect back and subsequently turn the ultrasonic waves into electrical energy (e.g., current and voltage), which is then transmitted/communicated to the signal processing module 24 for data processing as set forth in greater detail below.

As shown in FIG. 1, the data acquisition unit 26 may be located external and separate from the signal processing module 24. In this variation, the data acquisition unit 26 is in communication with the signal processing module 24 and receives the electrical signal from the signal processing module 24. In other examples, the data acquisition unit 26 may be controlled by another module (not shown), instead of the signal processing module 24, to receive the electrical signal. Other variations may also include the data acquisition unit 26 being integrated within the signal processing module 24 (not shown). These and other variations should be construed as falling within the scope of the present disclosure.

Now referring to FIG. 3, the inspection probe 22 is shown in an initial inspection position at the welded or brazed joint 10, between the two components 12. In this figure, a primary coupling medium as previously set forth is generally indicated by reference numeral 60. The primary coupling medium 60 is secured within the secondary enclosure 44 (also shown in FIG. 2) and is thus ultrasonically coupled to the transducer elements 52. Additionally, a fluid, or secondary coupling medium 62, which in one form is gel-based, is placed on the upper surface of the joint 10 between the upper surface of the joint 10 and the primary coupling medium 60. This secondary coupling medium 62 is provided to improve coupling of the inspection probe 22 to the joint 10 while pivoting on the pivot surfaces 42. In one form, the primary coupling medium 60 is a glycerin-based gel in which the viscosity has been modified to obtain a semi-solid coupling compound, and the secondary coupling medium 62 is a glycerin-based compound in which the viscosity has been modified to obtain a fluid compound, in order to fill any gaps between the joint 10 and the primary coupling medium 60 In another form, the primary and secondary coupling mediums could both be propylene glycol based, or other similar compounds. In another form, the secondary coupling medium could be water. The pivot surfaces 42 are placed against the upper surface of the joint 10 as shown in the initial inspection position. In one form of the present disclosure, the secondary coupling medium 62 is optional and only the primary coupling medium 60 is used.

The secondary coupling medium 62 may also be utilized within the internal cavity 36 of the inspection probe 22 between the primary coupling medium 60 and the transducer elements 52 of the inspection probe 22. Placing the secondary coupling medium 62 in this position allows the transducer elements 52 to maintain and stay substantially in ultrasonic contact with the primary coupling medium 60 while the inspection probe 22 is in operation.

Figure 4:
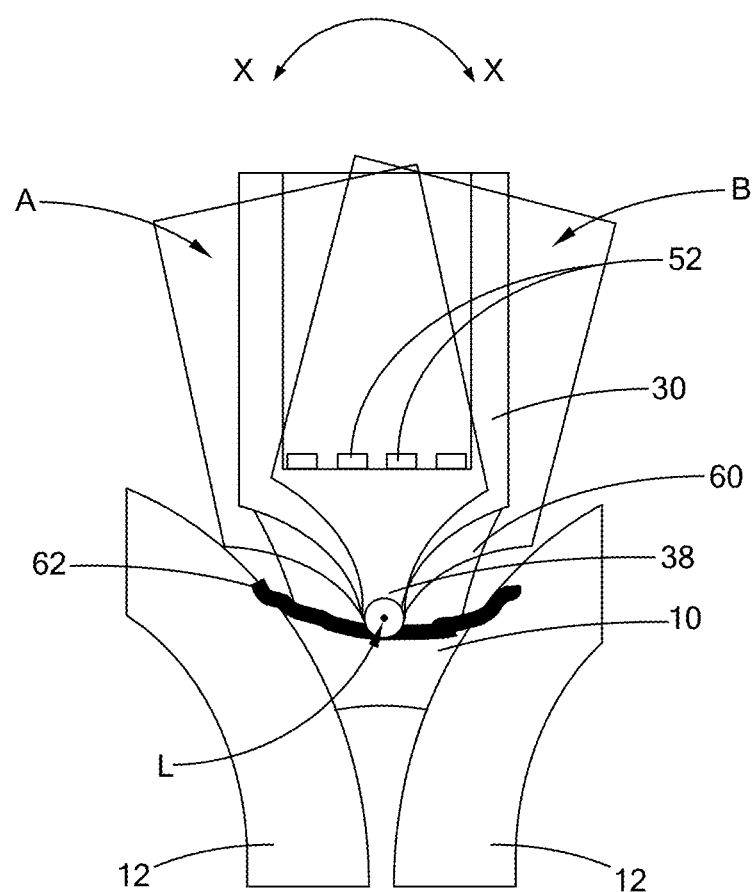
FIG. 4 is a schematic side view of the inspection probe in FIG. 1 pivoting through a plurality of positions across the welded or brazed joint in accordance with the teachings of the present disclosure.

Referring to FIG. 4, the motion of the inspection probe 22 is illustrated in greater detail. Once the inspection probe 22 is in its initial position in the center, it is rotated on the pivot surfaces 42, from left to right as shown along the arrow X-X about a pivot line "L" (extending in and out of the page). The inspection probe 22 can thus be rotated from the initial position to position "A" and then back over to position "B," if needed. This rotation of the inspection probe 22 is repeated to and from different angles around the pivot line "L" until adequate inspection/coverage of the joint 10 is established with the data collected from the transducer elements 52 and transmitted to the signal processing module 24 (FIG. 1). With an ultrasonic inspection technique, one or more ultrasonic data sets are acquired with the inspection probe 22 at one or more angles with respect to the joint 10. For each data set, a pulsed ultrasonic wave is emitted from one or more of the transducer elements 52 (i.e. at least one of a plurality of transducer elements 52), and the signals reflected from the various surfaces (both exterior and interior) of the joint 10 are recorded by all or a subset of the transducer elements 52. In one form, this process is repeated with each transducer element in the array of transducer elements 52 becoming the emitter in a technique known as full matrix capture. Any synthetic aperture data acquisition techniques other than full matrix are also applicable. For example, data acquisition techniques may include phasing for subsets of the transducer elements 52.

Referring back to FIG. 1, the signal processing module 24 in one form includes one or more memory devices 25 and one or more processing modules 27. The memory devices 25 may store, by way of example, one or more ultrasonic data sets. For example, data sets captured and transmitted by the inspection probe 22, via the plurality of transducer elements 52 to the one or more processing modules 27 can be stored in the memory devices 25. The processing modules 27 generally perform computations/analysis (as described in greater detail below) and provide electronic display signals to an optional graphical user interface 28. The system 20 may also include a wireless transceiver, a wireless receiver and/or other hardware or software to provide data communication among the various components of the system 20 and to other outside components/systems (not shown).

Figure 5A:
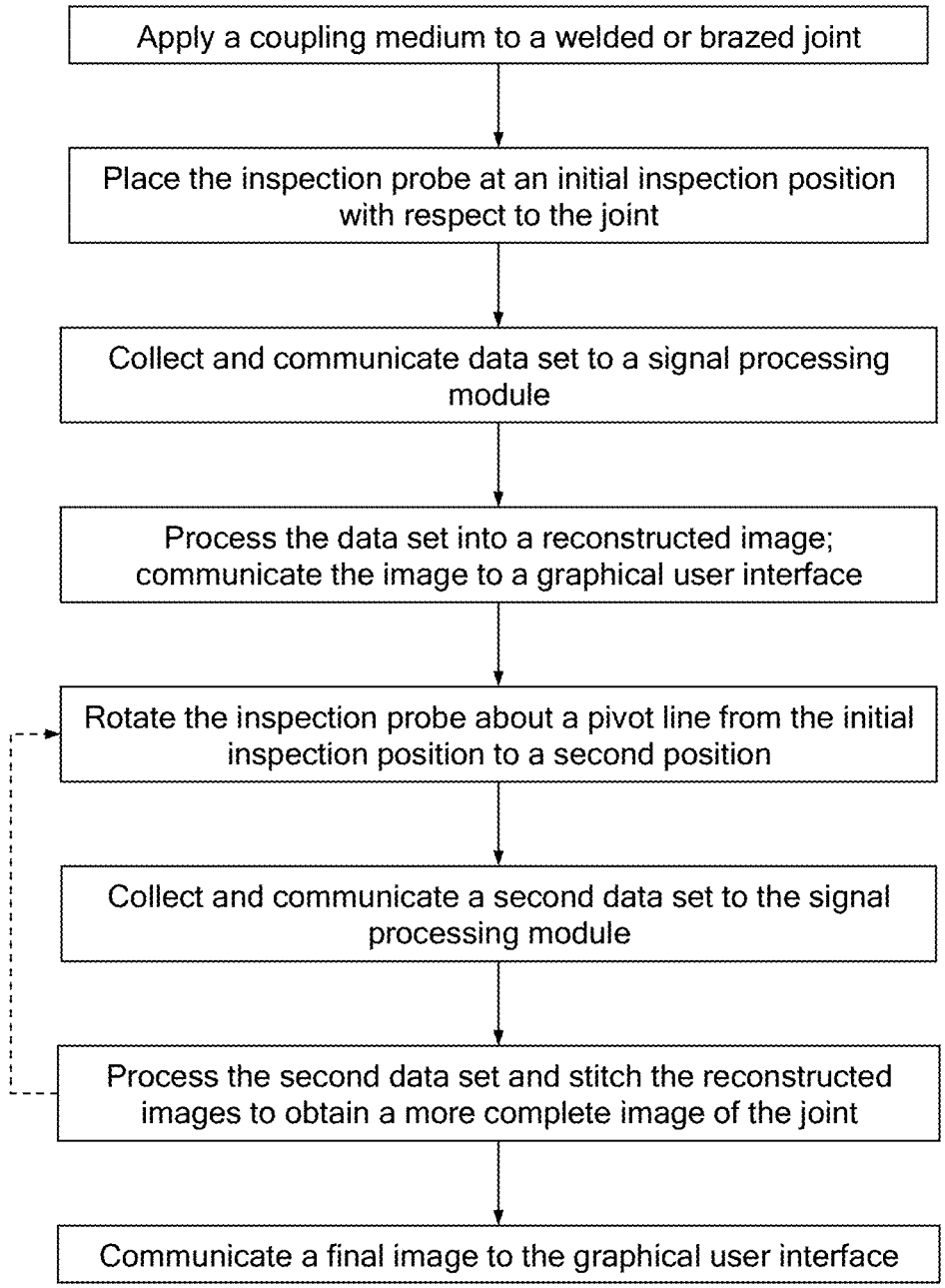
FIG. 5A is a flow chart of an example method of inspecting the welded or brazed joint between two components using the system in FIG. 1.

Referring now to FIG. 5A, an example method of inspecting the welded or brazed joint 10 with the inspection probe 22 will now be generally discussed. After applying the secondary coupling medium 62 to the joint 10, the inspection probe 22 is placed along with the primary coupling medium 60 at an initial inspection position and aligned along the upper surface of the joint 10. For example, the inspection probe 22 may be positioned along the upper surface of the joint 10 and rotated left to right as shown along the arrow X-X about the pivot line "L" as shown in FIG. 4.

With the inspection probe 22 now in position, the inspection probe 22 is held stationary in the initial inspection position on the pivot line "L" on the joint 10. The inspection probe 22 is held in place until the inspection probe 22 captures and communicates a first set of data to the signal processing module 24. Upon receipt, the signal processing module 24 processes the first set of data to compile a reconstructed image of the joint 10, which is communicated to the graphical user interface 28.

Next, the inspection probe 22 is rotated and traversed on or about the pivot line "L" on the joint 10 from a position A to a position B, or vice versa as shown in FIG. 4. The inspection probe 22 then captures and communicates a second set of data to the signal processing module 24 from the second inspection position.

The signal processing module 24 processes the second set of data to compile a reconstructed image representing the surfaces and sub-surfaces of the joint 10. The signal processing module 24 then stitches the two reconstructed images and communicates the more complete reconstructed image to the graphical user interface 28. In order to improve the quality of each of the reconstructed images, the signal processing module 24 computes time delays and amplitude scaling factors needed to correct the reconstructed image for acoustic-impedance mismatch and sound-speed mismatch between the primary coupling medium 60 and the joint 10.

In addition, as set forth below with reference to FIG. 5B, the reconstructed image is examined to determine whether the joint 10 has been sufficiently (according to predetermined inspection specifications) inspected. If the joint 10 has not been sufficiently inspected, the inspection probe 22 is rotated once again about the same pivoting point "L" or a different pivoting point along the upper surface of the joint 10 until a stitched reconstructed image of sufficient coverage is achieved. If the joint 10 has been sufficiently inspected, a quality evaluation of the joint 10 is conducted.

Figure 5B:
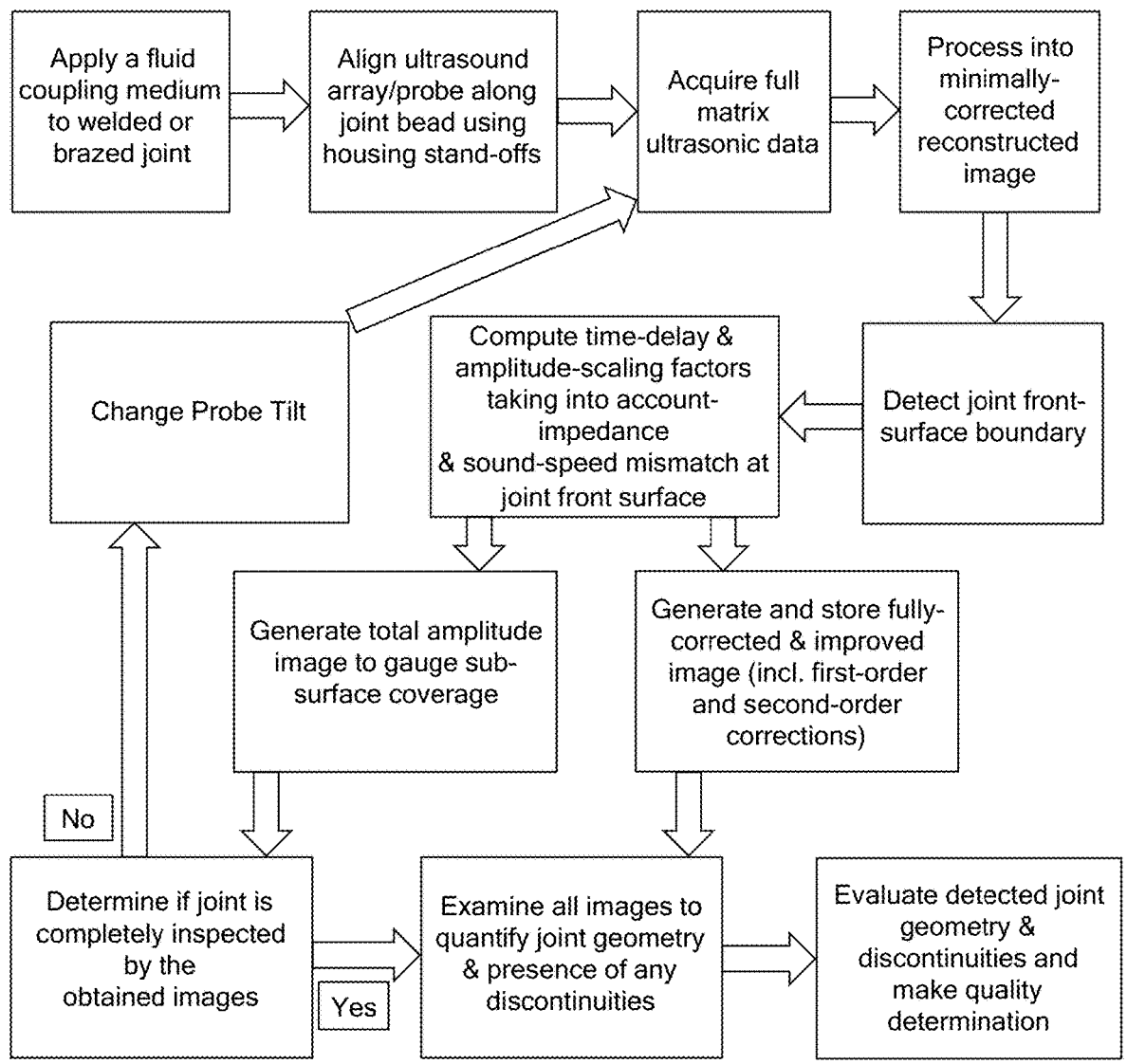
FIG. 5B is a flow chart of another example method of inspecting the welded or brazed joint between two components using the system in FIG. 1, wherein the system is an ultrasonic system and the inspection probe is an ultrasonic probe.

Now turning to FIG. 5B, another example method of inspecting the welded or brazed joint 10 with the innovative inspection probe 22 is illustrated and now described in greater detail. In this variation, the system 20 is an ultrasonic system and the inspection probe 22 is an ultrasonic inspection probe.

After applying the secondary coupling medium 62 to the joint 10, the inspection probe 22 is placed at the initial inspection position (shown in FIG. 3) and aligned along the welded or brazed joint 10 using the opposed tapered stand-offs 38. In this position, the primary coupling medium 60 is in contact with the transducer elements 52 and the secondary coupling medium 62, thus allowing for signals to be transmitted effectively between the transducer elements 52 and the welded or brazed joint 10 and the transducer elements 52.

After the inspection probe 22 is in position, pulsed ultrasonic waves are emitted from one or a subset of the transducer elements 52, and signals are reflected from the joint 10 back to the transducer elements 52. The inspection probe 22 is then rotated about the pivot line "L" and again held stationary on the joint, after which another set of data is collected by the transducer elements 52. Data (or data sets as set forth above) from the transducer elements 52 are transmitted/communicated to the signal processing module 24, which generates images obtained at different angles. These images are either stitched together to generate one inspection image, or utilized individually, to determine the extent of inspection/coverage of the joint 10. Generally, this process is repeated until the reconstructed image is sufficiently detailed and clear enough to allow determination or evaluation of the quality of the joint 10.

More specifically, using each data set (either by processing the data into an image or analyzing the raw reflected signals as a series of B-scans, 2D intensity plots of the total amplitude of the reflected ultrasonic energy), the location and geometry of the upper surface of the joint 10 are determined with respect to the transducer elements 52. Using this upper surface geometry, along with the acoustic properties of the secondary coupling medium 62 and the primary coupling medium 60 and the joint 10, a series of time delays and amplitude scaling factors are computed by simulating the ultrasound wave propagation into the joint 10. The time delays and amplitude scaling factors, also known as first-order and second-order corrections, respectively, are used to correct the raw data for the acoustic-impedance mismatch and sound-speed mismatch between the flexible, semi-solid gel and the joint material, allowing the analysis to compensate for curvature of the upper surface of the joint 10.

Figure 6A:
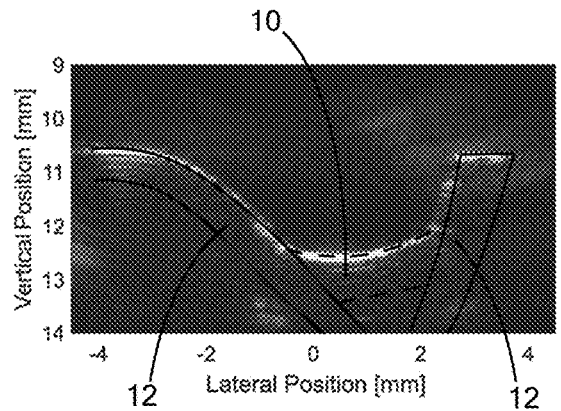
FIG. 6A is a minimally-corrected reconstructed image of a brazed joint while holding the inspection probe at a first position with respect to the joint.
Figure 6B:
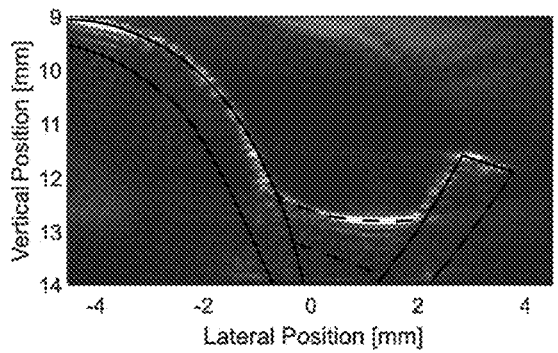
FIG. 6B is a minimally-corrected reconstructed image of the brazed joint of FIG. 6A, while the inspection probe is at a second position with respect to the joint.

Referring now to FIGS. 6A-6F, sample images using the aforementioned method are shown. First, minimally-corrected reconstructed images of the joint (the two images correspond to two different angles of the inspection probe 22 with respect to the same joint 10), are shown in FIGS. 6A and 6B. In FIGS. 6A and 6B, the acoustic-impedance mismatch and sound-speed mismatch at the braze front surface are not taken into account. Each of these reconstructed images, which do not include the further corrections set forth herein, is only utilized to locate the joint top surface with respect to the probe, so that the further corrections can be applied. Additionally, the CAD geometry of the components 12 (shown by the solid outlines) are automatically matched to the observed surfaces in FIGS. 6A and 6B, using a rigid-body registration process, in order to facilitate an operator in analyzing and quantifying the section geometry and discontinuities. The dashed lines on opposite sides of the joint 10 in FIGS. 6A-6F are used to guide the eye along the upper and lower surfaces of the weld or braze.

Figure 6C:
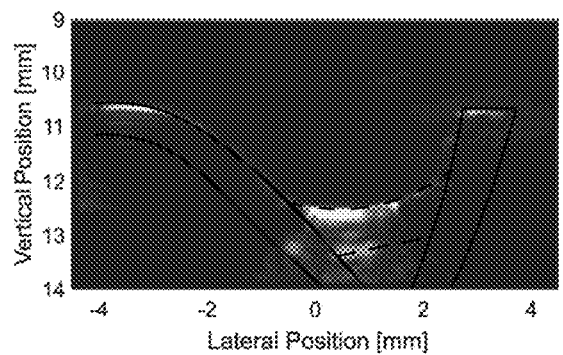
FIG. 6C is a fully-corrected reconstructed image of the same data set used in FIG. 6A, for which the first-order and second-order corrections, also known as time-delay and amplitude corrections, respectively, are applied.
Figure 6D:
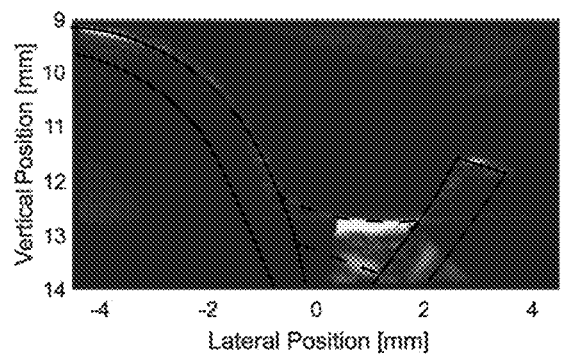
FIG. 6D is a fully-corrected reconstructed image of the same data set used in FIG. 6B, reconstructed as described relative to FIG. 6C.

After the time delays and amplitude scaling factors are computed and the raw data are corrected for the acoustic-impedance mismatch and sound-speed mismatch between the primary coupling medium 60 and the joint 10, high-resolution images of the interior and exterior surfaces of the joint 10 are generated as shown in FIGS. 6C and 6D. In FIGS. 6C and 6D, the first-order and second-order corrections are applied, taking into account the effect of the acoustic-impedance mismatch and sound-speed mismatch at the joint surface. Including the amplitude scaling factors in the image reconstruction is a novel addition, providing the required improvement in imaging the joint interior of highly curved weld or braze joints 10. More specifically, the propagation of the ultrasonic wave transmitted from each transducer element 52 is simulated using numerical techniques to determine the signal characteristics that would be present between the transducer elements 52 and every point in space. For each signal, the first-order and second-order corrections correspond to the time for which the signal displays a maximum amplitude and the corresponding amplitude, respectively. These calculations can be performed using a ray series expansion, finite element methods, or spectral techniques, among other possible approaches.

Figure 6E:
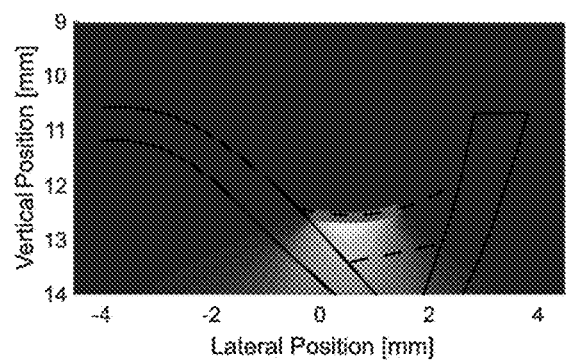
FIG. 6E is a reconstructed image of total amplitude of an ultrasonic wave detected from the joint according to the inspection probe being in the first position of FIG. 6A.
Figure 6F:
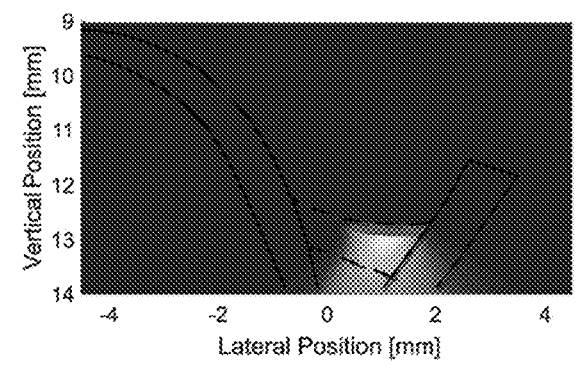
FIG. 6F is a reconstructed image of total amplitude of an ultrasonic wave detected from the joint according to the inspection probe being in the second position of FIG. 6B.

Referring next to FIGS. 6E and 6F, the total amplitude of ultrasonic waves reflected from the joint 10 is used to calculate the amount of energy that penetrated the joint 10, thus allowing an operator (or the processing module 27 in the signal processing module 24) to determine the amount of joint inspected by the data sets. If the amplitude distribution is inadequate to fully inspect the joint 10, the inspection probe 22 is subsequently pivoted again to collect additional data sets until a sufficient amplitude distribution is achieved. This process can be achieved manually by an operator or automatically by the processing module 27, for example by controlling a motor (not shown) or rotational/translation device (not shown) attached to the probe 22, or a combination thereof. Accordingly each feature of the joint 10 and any possible discontinuities or imperfections are assessed by the operator and/or processing module 27 according to an applicable engineering/quality specification, allowing quantitative comparison of the measured features and possible discontinuities to the specification to determine joint quality.

As disclosed above, the present disclosure provides innovative systems and methods for inspecting a welded or brazed joint. These systems and methods resolve issues in coupling, scanning, and image construction of joints of small size and/or with highly-curved surfaces, by utilizing the innovative inspection probe 22 (for easy and controlled alignment of the inspection probe 22 with the joint 10 in a wide variety of joints), combined with a primary or flexible semi-solid coupling medium 60 (securely coupled to the transducer elements 52 using a secondary enclosure 44) and fluid coupling gel or a secondary coupling medium 62, and additionally enhanced data analysis algorithms, utilizing time delays and amplitude scaling factors as set forth above.

The systems and methods disclosed herein can increase the cost-effectiveness of welding and brazing operations by reducing destructive inspection costs. Scrap savings and throughput improvement can be realized with the implementation of the aforementioned robust non-destructive evaluation method.

Further, the teachings of the present disclosure go beyond the current state-of-the-art, for which the acoustic-impedance mismatch and sound-speed mismatch between the primary coupling medium 60 and the joint 10 are only compensated for by computing the time delays caused by a joint upper surface, while ignoring an amplitude change. This approach provides only a first-order correction to a beam path, which might not allow a joint interior to be imaged over a sufficiently large lateral extent of the joint to provide adequate inspection. The systems and methods as disclosed herein include both the first-order time-delay compensation and the second-order amplitude compensation to enhance an ultrasonic image of the joint interior. These added corrections play a significant role in obtaining an accurate image of joint interior over a larger extent of the joint, especially as the joint surface curvature increases.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

The apparatuses and methods described in this application may be partially or fully implemented by a special purpose computer created by configuring a general-purpose computer to execute one or more particular functions embodied in computer programs. The functional blocks, flow chart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An inspection probe comprising:
   a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure; and
   a plurality of transducer elements disposed within the internal cavity of the housing.

2. The inspection probe according to claim 1, further comprising a primary coupling medium made of a flexible, semi-solid material, the primary coupling medium being secured between the opposed tapered standoffs within the secondary enclosure.

3. The inspection probe according to claim 1, further comprising a plurality of serrations disposed on inner faces of the opposed tapered standoffs.

4. The inspection probe according to claim 1, wherein the plurality of transducer elements form a one-dimensional array.

5. The inspection probe according to claim 1, wherein the plurality of transducer elements form a two-dimensional array.

6. The inspection probe according to claim 1, wherein the opposed tapered standoffs define arcuate outer profiles.

7. The inspection probe according to claim 1, wherein the opposed tapered standoffs are flexible.

8. A system for inspecting a welded or brazed joint, the system comprising:
   an inspection probe comprising:
      a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure;
      a plurality of transducer elements disposed within the internal cavity of the housing; and
      a primary coupling medium comprising a flexible, semi-solid material secured between the opposed tapered standoffs;

a signal processing module in communication with the plurality of transducer elements; and a data acquisition unit in communication with the plurality of transducer elements.

9. The system according to claim 8, further comprising a graphical user interface in communication with the signal processing module and configured to display at least one reconstructed image of the welded or brazed joint.

10. The system according to claim 9, wherein the reconstructed image is one of a 2D image and a 3D image.

11. The system according to claim 8, wherein the signal processing module comprises algorithms that stitch images obtained at different angles when the inspection probe is rotated or traversed across the welded or brazed joint.

12. The system according to claim 11, wherein the stitched images are mapped to CAD (computer aided design) geometry for display on a graphical user interface.

13. The system according to claim 8, wherein a pulsed energy wave is emitted from at least one of the plurality of transducer elements and signals reflected from the welded or brazed joint are recorded by at least one of the plurality of transducer elements.

14. The system according to claim 13, wherein the signal processing module calculates a series of time delays and amplitude scaling factors to correct raw data received from the plurality of transducer elements to compensate for acoustic-impedance mismatch and sound-speed mismatch between the primary coupling medium and the welded or brazed joint.

15. A method of inspecting a welded or brazed joint, the method comprising:
(a) placing an inspection probe at an initial inspection position, the inspection probe comprising:
a housing having a proximal end portion and a distal end portion, the housing defining an internal cavity disposed at the proximal end portion and opposed tapered standoffs disposed at the distal end portion, wherein distal ends of the opposed tapered standoffs define pivot surfaces, and the opposed tapered standoffs are spaced apart to define a secondary enclosure;
a plurality of transducer elements disposed within the internal cavity of the housing; and
a primary coupling medium comprising a flexible, semi-solid material secured between the opposed tapered standoffs,
(b) communicating data from the plurality of transducer elements to a signal processing module at the initial inspection position;
(c) rotating the inspection probe across the welded or brazed joint about a pivot line extending between the opposed tapered standoffs to a stationary inspection position;
(d) communicating data from the plurality of transducer elements to the signal processing module at the stationary inspection position;
(e) stitching images obtained at different angles to generate an inspection image; and
(f) optionally repeating steps (c) through (e) until a reconstructed image reaches a predetermined level of detail.

16. The method according to claim 15, further comprising:
moving the inspection probe along the welded or brazed joint to another location a predetermined distance from the initial inspection position; and
repeating steps (c) through (f) for a predetermined number of locations along a length of the welded or brazed joint.

17. The method according to claim 15, further comprising applying a secondary coupling medium between the welded or brazed joint and the primary coupling medium.

18. The method according to claim 15, further comprising calculating a series of time delays and amplitude scaling factors to correct raw data received from the plurality of transducer elements to compensate for acoustic-impedance mismatch and sound-speed mismatch between the flexible, semi-solid material and the welded or brazed joint.

19. The method according to claim 18, wherein the series of time delays and amplitude scaling factors are computed by simulating a signal propagation into the welded or brazed joint.

20. The method according to claim 19, further comprising generating an amplitude distribution map and determining if the welded or brazed joint is sufficiently inspected.

* * * * *